(12) United States Patent
Lee

(10) Patent No.: US 10,123,420 B2
(45) Date of Patent: Nov. 6, 2018

(54) COIL ELECTRONIC COMPONENT

(71) Applicant: SAMSUNG ELECTRO-MECHANICS CO., LTD., Suwon-si, Gyeonggi-do (KR)

(72) Inventor: Hae Jong Lee, Suwon-si (KR)

(73) Assignee: Samsung Electro-Mechanics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/259,308

(22) Filed: Sep. 8, 2016

(65) Prior Publication Data
US 2017/0196091 A1    Jul. 6, 2017

(30) Foreign Application Priority Data

Dec. 30, 2015    (KR) .................. 10-2015-0189255

(51) Int. Cl.
H01F 17/00 (2006.01)
H05K 1/18 (2006.01)
H01F 27/28 (2006.01)
H01F 27/255 (2006.01)
H01F 27/36 (2006.01)
H01F 27/29 (2006.01)

(52) U.S. Cl.
CPC .......... *H05K 1/181* (2013.01); *H01F 27/255* (2013.01); *H01F 27/2804* (2013.01); *H01F 27/292* (2013.01); *H01F 27/367* (2013.01); *H01F 2027/2809* (2013.01); *H05K 2201/1003* (2013.01); *Y02P 70/611* (2015.11)

(58) Field of Classification Search
CPC .................................................. H01F 17/0013
See application file for complete search history.

(56) References Cited

U.S. PATENT DOCUMENTS

2009/0283306 A1\* 11/2009 Nishino ................ C03C 8/02
                                                                    174/257
2016/0268039 A1\* 9/2016 Park ..................... H01F 27/292

FOREIGN PATENT DOCUMENTS

| JP | 11-224817 A | 8/1999 |
| JP | 2005-317775 A | 11/2005 |
| KR | 10-2005-0011090 A | 1/2005 |

\* cited by examiner

*Primary Examiner* — Jeremy C Norris
(74) *Attorney, Agent, or Firm* — McDermott Will & Emery LLP

(57) ABSTRACT

A coil electronic component includes: a magnetic body including first and second coil parts spaced apart from each other, wherein the coil parts each include first and second coil conductors respectively disposed on first and second surfaces of a substrate, and a non-magnetic film disposed between the first and second coil parts.

20 Claims, 7 Drawing Sheets

COIL ELECTRONIC COMPONENT

CROSS-REFERENCE TO RELATED APPLICATION

This application claims the benefit of priority to Korean Patent Application No. 10-2015-0189255, filed on Dec. 30, 2015 with the Korean Intellectual Property Office, the entirety of which is incorporated herein by reference.

BACKGROUND

The present disclosure relates to a coil electronic component.

An inductor, which is a type of coil electronic component, is a representative passive element that maybe used to configure an electronic circuit together with a resistor and a capacitor to remove noise.

In order to reduce a mounting area of passive elements mounted on a printed circuit board, an array type inductor in which a plurality of coil parts are disposed in a coil may be used.

SUMMARY

An aspect of the present disclosure provides a coil electronic component capable of suppressing harmful mutual interference of magnetic flux occurring from a plurality of coil parts disposed in a coil.

According to an aspect of the present disclosure, a coil electronic component includes a magnetic body in which coil parts formed by connecting coil conductors disposed on one surface and the other surface of a substrate are embedded, wherein the magnetic body includes first and second coil parts disposed to be spaced apart from each other, and a non-magnetic film disposed between the first and second coil parts.

According to another aspect of the present disclosure, a coil electronic component includes a magnetic body in which coil parts formed by connecting coil conductors disposed on one surface and the other surface of a substrate are embedded, wherein the magnetic body includes first and second coil parts disposed to be spaced apart from each other, and a gap part disposed between the first and second coil parts, and suppressing mutual interference of magnetic flux occurring from the first and second coil parts.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
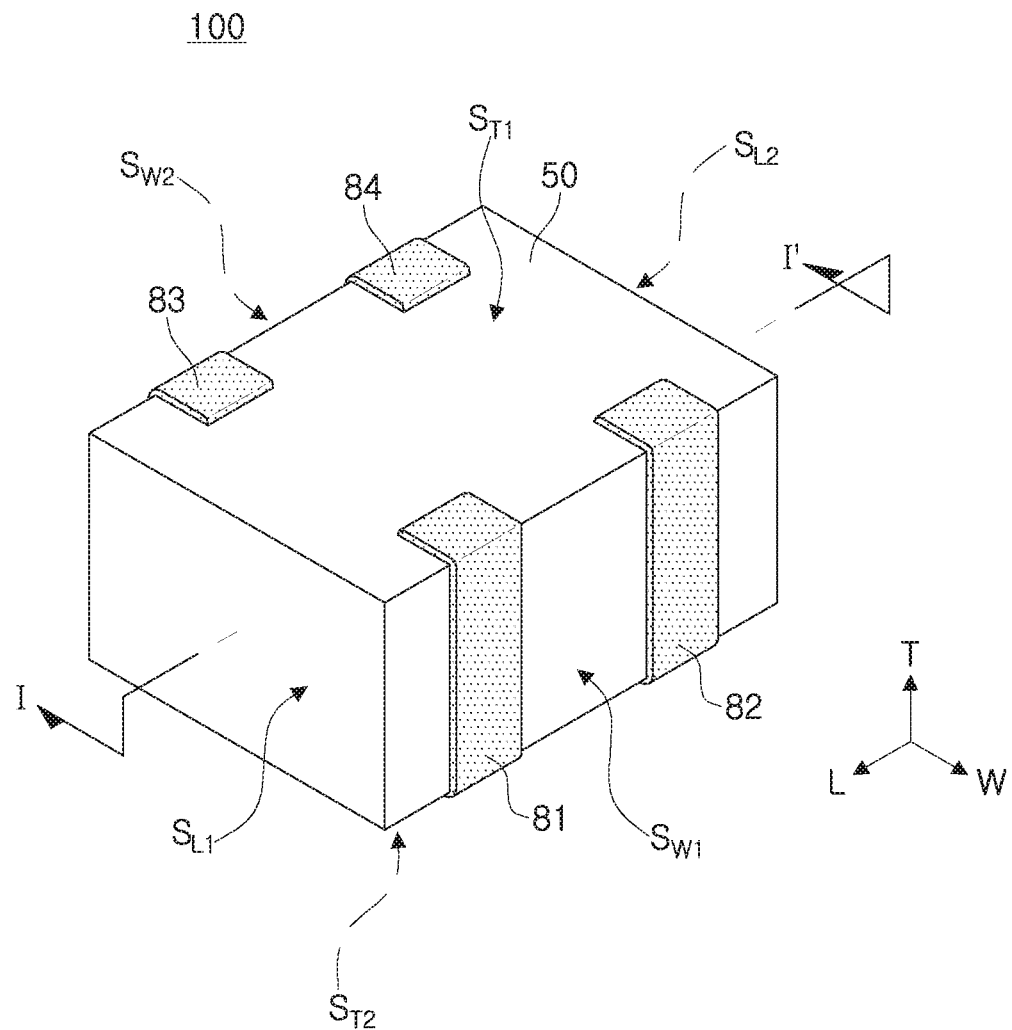
FIG. 1 is a perspective view of a coil electronic component according to an exemplary embodiment in the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Coil Electronic Component

Hereinafter, a coil electronic component according to an exemplary embodiment in the present disclosure, in particular a thin film type inductor, will be described. However, the present disclosure is not limited thereto.

Figure 2:
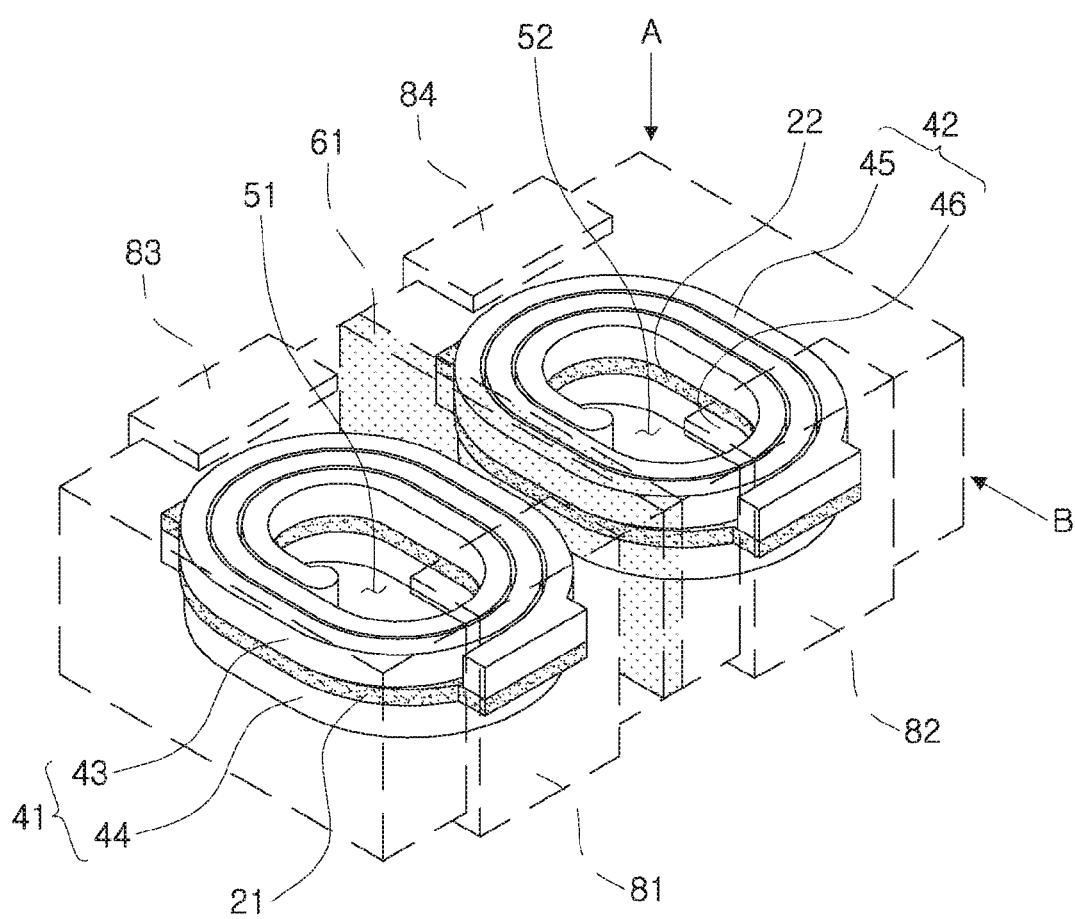
FIG. 2 is a perspective view illustrating a coil electronic component according to an exemplary embodiment in the present disclosure so that coil parts of the coil electronic component are visible.

FIG. 1 is a perspective view of a coil electronic component according to an exemplary embodiment in the present disclosure, and FIG. 2 is a perspective view illustrating a coil electronic component according to the exemplary embodiment so that coil parts of the coil electronic component are visible.

Referring to FIGS. 1 and 2, as an example of a coil electronic component, a thin film type inductor used in a power line of a power supply circuit is disclosed.

A coil electronic component 100 according to the exemplary embodiment may include a magnetic body 50, first and second coil parts 41 and 42 embedded in the magnetic body 50, a non-magnetic film 61 disposed between the first and second coil parts 41 and 42, and first to fourth external electrodes 81, 82, 83, and 84 disposed on outer surfaces of the magnetic body 50.

In the exemplary embodiment, defined terms referred to as "first," "second," and "first to fourth" are used merely to distinguish the object, and are not limited to the above-mentioned order.

In the coil electronic component 100 according to the exemplary embodiment, a "length direction" refers to an "L" direction of FIG. 1, a "width direction" refers to a "W" direction of FIG. 1, and a "thickness direction" refers to a "T" direction of FIG. 1.

The magnetic body 50 may include first and second end surfaces $S_{L1}$ and $S_{L2}$ opposing each other in a length L direction of the magnetic body 50, first and second side surfaces $S_{W1}$ and $S_{W2}$ connecting the first and second end surfaces $S_{L1}$ and $S_{L2}$ and opposing each other in a width W direction of the magnetic body 50, and first and second main surfaces $S_{T1}$ and $S_{T2}$ opposing each other in a thickness T direction of the magnetic body 50.

The magnetic body 50 may include any material without being limited as long as the material exhibits magnetic properties. For example, the magnetic body 50 may include a ferrite or a metallic magnetic powder.

The ferrite may be, for example, an Mn—Zn based ferrite, a Ni—Zn based ferrite, a Ni—Zn—Cu based ferrite, an Mn—Mg based ferrite, a Ba-based ferrite, a Li-based ferrite, or the like.

The magnetic metallic powder may be a crystalline or amorphous metal including any one or more selected from the group consisting of iron (Fe), silicon (Si), boron (B), chromium (Cr), aluminum (Al), copper (Cu), niobium (Nb), and nickel (Ni).

For example, the magnetic metallic powder may be an Fe—Si—B—Cr based amorphous metal.

The magnetic metallic powder may be included in a form in which it is dispersed in a thermosetting resin such as an epoxy resin, polyimide, or the like.

The magnetic body 50 may include the first and second coil parts 41 and 42 disposed to be spaced apart from each other.

That is, the coil electronic component 100 according to the exemplary embodiment may have a basic structure of an inductor array type in which two or more coil parts are disposed in the same coil.

The first and second coil parts 41 and 42 may be formed by connecting first coil conductors 43 and 45 respectively formed on a first surface of each of first and second substrates 21 and 22 disposed to be spaced apart from each other in the magnetic body 50 and second coil conductors 44 and 46 respectively formed on a second surface of each of the substrates 21 and 22 opposing the first surface of each of the substrates 21 and 22.

Each of the first and second coil conductors 43, 44, 45, and 46 may have a planar coil form formed on the same plane of the first and second substrates 21 and 22.

The first and second coil conductors 43, 44, 45, and 46 may be formed in a spiral shape, and the first and second coil conductors 43, 44, 45, and 46 formed on the first and second surfaces of the substrates 21 and 22 may be electrically connected to each other through a via (not illustrated) formed to penetrate through the substrates 21 and 22.

The first and second coil conductors 43, 44, 45, and 46 maybe formed by performing electroplating on the substrates 21 and 22, but are not limited thereto.

The first and second coil conductors 43, 44, 45, and 46 and the via may be formed of a metal having excellent electrical conductivity, and may be formed of, for example, silver (Ag), palladium (Pd), aluminum (Al), nickel (Ni), titanium (Ti), gold (Au), copper (Cu), platinum (Pt), alloys thereof, or the like.

The first and second coil conductors 43, 44, 45, and 46 may be coated with an insulating layer (not illustrated) so as not to directly be in contact with a magnetic material forming the magnetic body 50.

The first and second coil parts 41 and 42 may be disposed in a symmetrical shape in relation to a central portion of the magnetic body 50 in the length L direction thereof.

The first and second substrates 21 and 22 may be formed of, for example, a polypropylene glycol (PPG) substrate, a ferrite substrate, a metal based soft magnetic substrate, or the like.

A central portion of the first and second substrates 21 and 22 may be penetrated to form a through hole, and the through hole may be filled with the magnetic material to form first and second core parts 51 and 52. That is, the first and second core parts 51 and 52 may be formed in inner portions of the first and second coil parts 41 and 42, respectively.

As the first and second core parts 51 and 52 filled with the magnetic material are formed in the inner portions of the first and second coil parts 41 and 42, inductance L may be improved.

The first and second coil parts 41 and 42 may be disposed to be spaced apart from each other by a predetermined distance in the length L direction of the magnetic body 50, and the non-magnetic film 61 may be disposed between the first and second coil parts 41 and 42.

The non-magnetic film 61 may be disposed between the first and second coil parts 41 and 42, and may be disposed while being in contact with the first and second side surfaces $S_{W1}$ and $S_{W2}$ of the magnetic body 50 in the width W direction of the magnetic body 50.

Further, the non-magnetic film 61 maybe disposed while being in contact with the first and second main surfaces $S_{T1}$ and $S_{T2}$ of the magnetic body 50 opposing each other in a thickness T direction of the magnetic body 50.

According to an exemplary embodiment, by forming the non-magnetic film 61 between the first and second coil parts 41 and 42, harmful mutual interference of magnetic flux occurring from a plurality of coil parts may be suppressed.

When a coil electronic component of an array type in which the plurality of coil parts are disposed in the coil, malfunctioning of the product may occur and efficiency may be deteriorated due to harmful interference between the coil parts.

Further, as the coil electronic component is gradually miniaturized, an interval between the plurality of coil parts embedded in the coil electronic component becomes narrow, and it maybe difficult to suppress the harmful interference between the coil parts only by adjusting a shape and a position relationship of the coil parts.

Therefore, according to an exemplary embodiment, the non-magnetic film 61 which is in contact with the first and second side surfaces $S_{W1}$ and $S_{W2}$ of the magnetic body 50 in the width W direction of the magnetic body 50 and is in contact with the first and second main surfaces $S_{T1}$ and $S_{T2}$ of the magnetic body 50 opposing each other in the thickness T direction of the magnetic body 50 is formed between the first and second coil parts 41 and 42, and thus the harmful mutual interference of the magnetic flux occurring from the plurality of coil parts may be suppressed.

The non-magnetic film 61 may be formed of any material without being particularly limited as long as the material may suppress the harmful mutual interference of the magnetic flux occurring from the first and second coil parts 41 and 42, and may be formed of a material different from that forming the magnetic body 50.

The material different from that forming the magnetic body 50 may include the same material as that forming the magnetic body 50, but a composition thereof is different.

For example, the non-magnetic film 61 may include glass.

Further, the non-magnetic film 61 may include any one or more selected from the group consisting of a thermosetting resin, a metallic magnetic powder, a ferrite, and a dielectric, but is not limited thereto.

The non-magnetic film 61 may have permeability lower than that of the magnetic body 50. Therefore, the harmful mutual interference of the magnetic flux occurring from the first and second coil parts 41 and 42 may be suppressed.

The first and second coil parts 41 and 42 may be connected to the first to fourth external electrodes 81, 82, 83, and 84 disposed on the outer surfaces of the magnetic body 50 to be electrically connected thereto.

The first to fourth external electrodes 81, 82, 83, and 84 may be formed on the side surfaces $S_{W1}$ and $S_{W2}$ of the magnetic body 50 in the width direction of the magnetic body 50, and may be formed to be extended to the first and second main surfaces $S_{T1}$ and $S_{T2}$ of the magnetic body 50 in the thickness T direction of the magnetic body 50.

The first to fourth external electrodes 81, 82, 83, and 84 may be disposed to be spaced apart from each other, and may be electrically separated from each other.

The first to fourth external electrodes 81, 82, 83, and 84 may be formed of a metal having excellent electrical conductivity, and may be formed of, for example, silver (Ag), palladium (Pd), aluminum (Al), nickel (Ni), titanium (Ti), gold (Au), copper (Cu), platinum (Pt), alloys thereof, or the like.

Figure 3A:
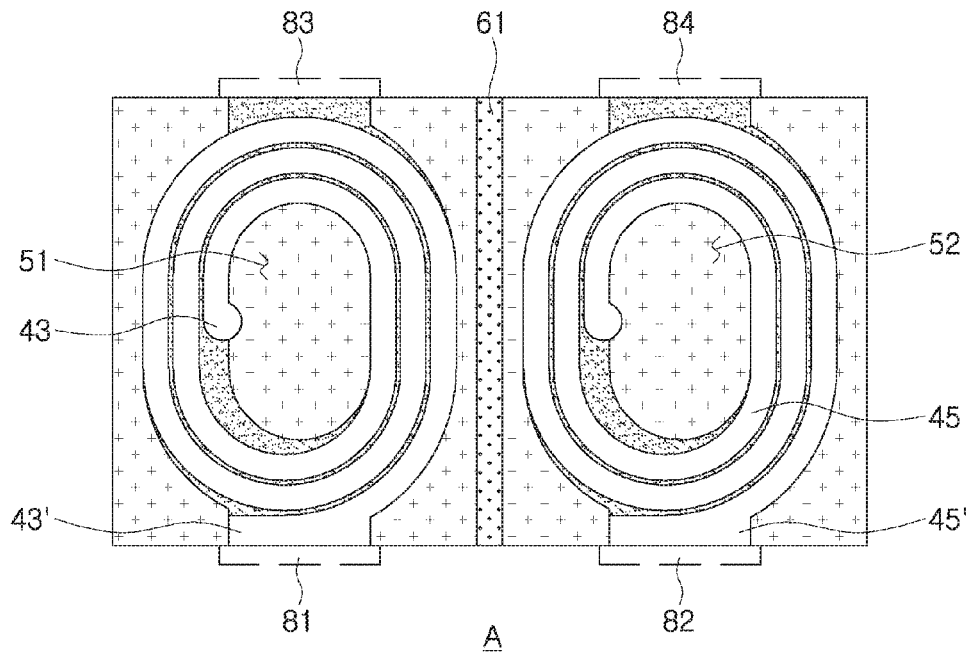
FIG. 3A is an inner projection plan view when being viewed from a direction A of FIG. 2.
Figure 3B:
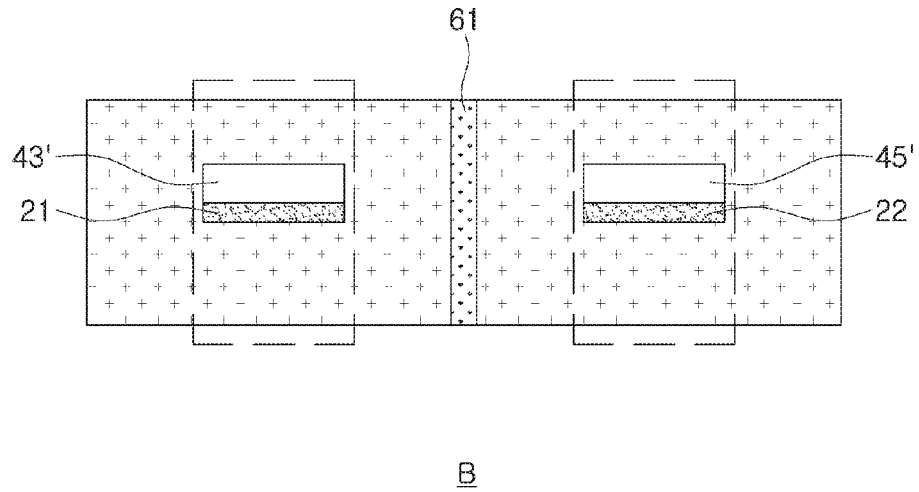
FIG. 3B is an inner projection plan view when being viewed from a direction B of FIG. 2.

FIG. 3A is an inner projection plan view when being viewed from a direction A of FIG. 2, and FIG. 3B is an inner projection plan view when being viewed from direction of B of FIG. 2.

Referring to FIG. 3A, the first and second coil parts 41 and 42 may be formed by extending an end portion of each of the first coil conductors 43 and 45, and may include first lead parts 43' and 45' exposed to the first side surface $S_{W1}$ of the magnetic body 50 in the width direction of the magnetic body 50, and second lead parts (not illustrated) formed by extending an end portion of each of the second coil conductors 44 and 46 and exposed to the second side surface $S_{W2}$ of the magnetic body 50 in the width direction of the magnetic body 50.

The first lead parts 43' and 45' may be connected to the first and second external electrodes 81 and 82 disposed on the first side surface $S_{W1}$ of the magnetic body 50 in the width direction of the magnetic body, and the second lead parts (not illustrated) may be connected to the third and fourth external electrodes 83 and 84 disposed on the second side surface $S_{W2}$ of the magnetic body 50 in the width direction of the magnetic body 50.

The first and second external electrodes 81 and 82 may be input terminals, and the third and fourth external electrodes 83 and 84 may be output terminals, but are not limited thereto.

For example, a current input from the first external electrode 81, which is an input terminal, may flow into the third external electrode 83, which is an output terminal, through the first coil conductor 43 of the first coil part 41, the via, and the second coil conductor 44 of the first coil part 41.

Similarly, a current input from the second external electrode 82, which is the input terminal, may flow into the fourth external electrode 84, which is the output terminal, through the first coil conductor 45 of the second coil part 42, the via, and the second coil conductor 46 of the second coil part 42.

The non-magnetic film 61 may be disposed while being in contact with the first and second side surfaces $S_{W1}$ and $S_{W2}$ of the magnetic body 50 in the width W direction of the magnetic body 50.

A thickness of the non-magnetic film 61 is not particularly limited, and mutual interference between the first and second coil parts 41 and 42 may be adjusted and a coupling value may be controlled by adjusting the thickness of the non-magnetic film 61.

Referring to FIG. 3B, the non-magnetic film 61 may be formed to be in contact with the first and second main surfaces $S_{T1}$ and $S_{T2}$ of the magnetic body 50 in the thickness T direction of the magnetic body 50. That is, the non-magnetic film 61 may be formed to have the same height as the thickness T of the magnetic body 50.

Figure 4:
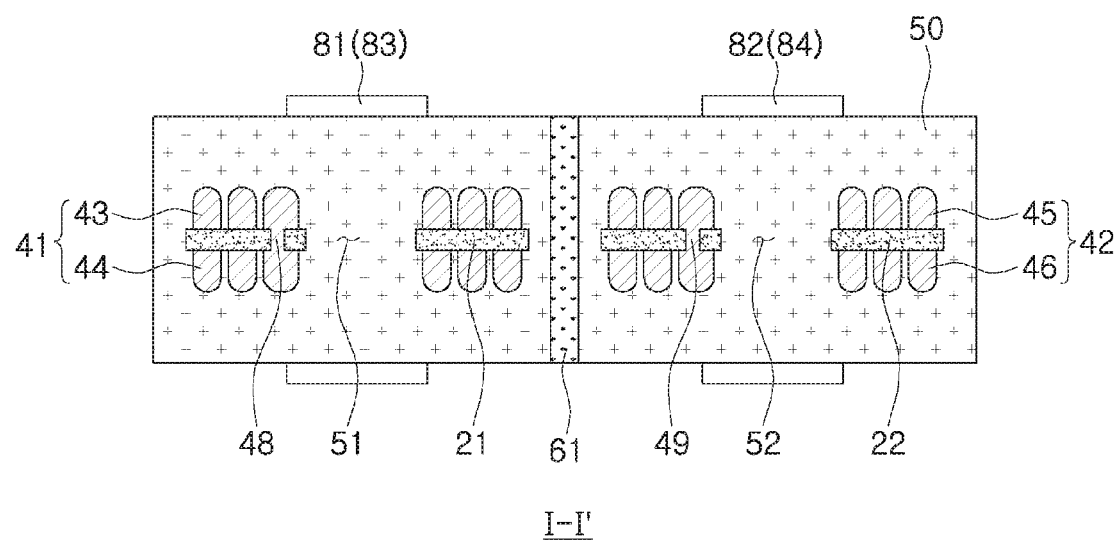
FIG. 4 is a cross-sectional view taken along line I-I' of FIG. 1.

FIG. 4 is a cross-sectional view taken along line I-I' of FIG. 1.

Referring to FIG. 4, the first and second coil conductors 43 and 45 disposed on the first surface of each of the substrates 21 and 22, and the second coil conductors 44 and 46 disposed on the second surface of each of the substrates 21 and 22 may be connected by the vias 48 and 49 penetrating through the substrates 21 and 22.

The non-magnetic film 61 disposed between the first and second coil parts 41 and 42 may be formed while being in contact with the first and second side surfaces $S_{W1}$ and $S_{W2}$ of the magnetic body 50 in the width direction of the magnetic body 50.

The mutual interference between the first and second coil parts 41 and 42 may be adjusted, and the coupling value may be controlled by variously changing a height, an interval, a material, or the like of the non-magnetic film 61.

Figure 5A:
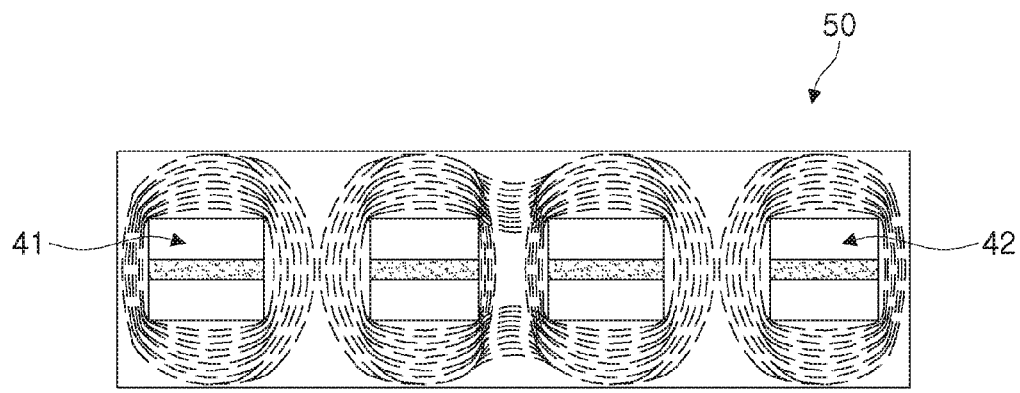
FIG. 5A is a view illustrating magnetic flux formed in a coil electronic component in which a non-magnetic film is not disposed, according to the related art.
Figure 5B:
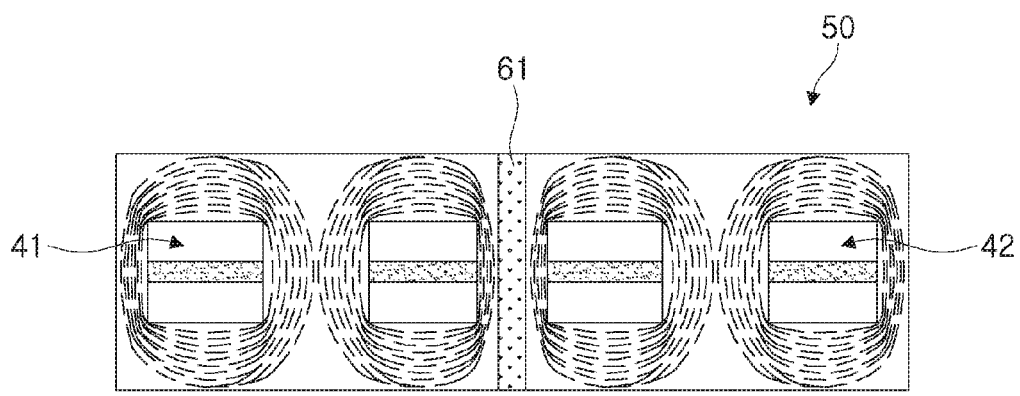
FIG. 5B is a view illustrating magnetic flux formed in a coil electronic component according to an exemplary embodiment in the present disclosure.

FIG. 5A is a view illustrating magnetic flux formed in a coil electronic component in which a non-magnetic film is not disposed, according to the related art, and FIG. 5B is a view illustrating magnetic flux formed in a coil electronic component according to an exemplary embodiment in the present disclosure.

Referring to FIG. 5A, in a case of a coil electronic component in which the non-magnetic film is not disposed, mutual interference of magnetic flux between the first and second coil parts 41 and 42 may occur.

Conversely, referring to FIG. 5B, by disposing the non-magnetic film 61 between the first and second coil parts 41 and 42, the mutual interference of the magnetic flux between the first and second coil parts 41 and 42 may be suppressed.

Figure 6:
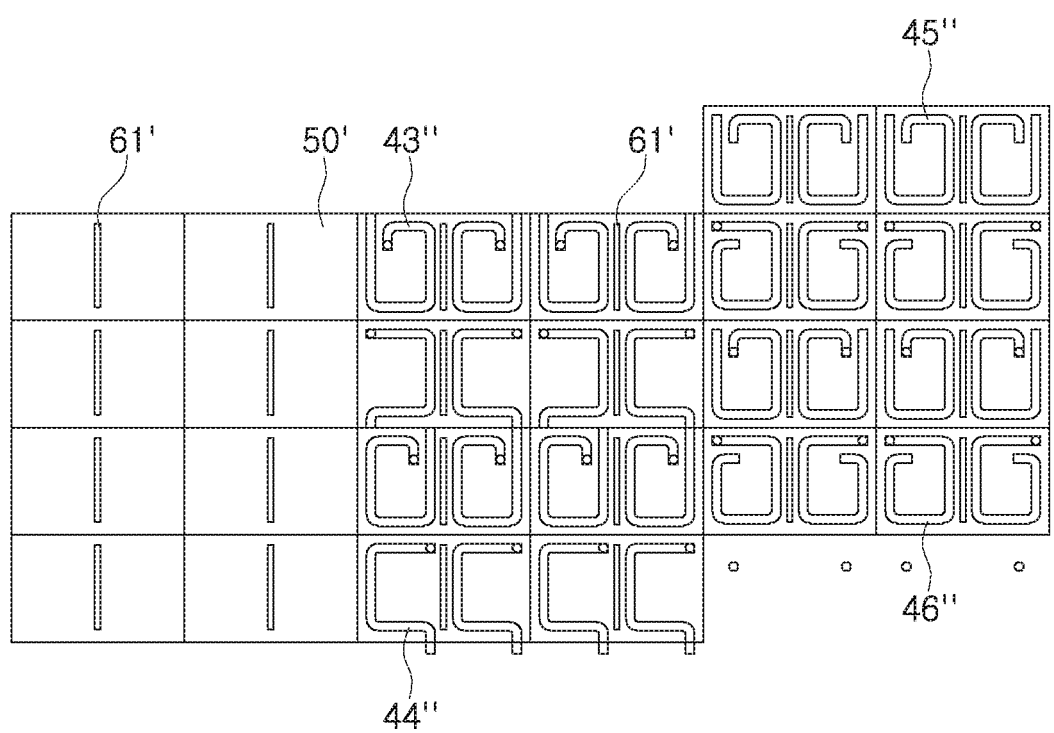
FIG. 6 is a plan view illustrating a pattern shape of coil parts of the coil electronic component of FIG. 1.

FIG. 6 is a plan view illustrating a pattern shape of coil parts of the coil electronic component of FIG. 1.

Referring to FIG. 6, in the coil electronic component according to an exemplary embodiment, according to a method of forming the first and second coil parts 41 and 42, the non-magnetic film 61, and the magnetic body 50, coil conductor patterns 43″, 44″, 45″, and 46″ which become the first and second coil conductors 43, 44, 45, and 46 may be formed on the substrate by performing plating, and non-magnetic film patterns 61′ may be formed between the first coil conductors and the second coil conductors.

Further, cover regions disposed on upper and lower portions of the first and second coil parts 41 and 42 may be formed by stacking magnetic sheets 50′ forming the magnetic body 50. Here, the non-magnetic film patterns 61′ formed between the first coil conductors and the second coil conductors may be formed on central regions of the magnetic sheets 50′.

Next, the magnetic body 50 may be formed by the coil parts formed by connecting the coil conductors disposed on one surface and the other surface of the substrate and the magnetic sheets 50′ stacked on upper and lower portions of the coil parts. Here, the non-magnetic film patterns 61′ may be disposed between the first and second coil parts 41 and 42 to form the non-magnetic film 61, thereby implementing the coil electronic component according to an exemplary embodiment.

According to another exemplary embodiment, a coil electronic component may include a magnetic body in which coil parts formed by connecting coil conductors disposed on one surface and the other surface of a substrate are embedded, wherein the magnetic body may include first and second coil parts disposed to be spaced apart from each other, and may include a gap part disposed between the first and second coil parts and suppressing mutual interference of magnetic flux occurring from the first and second coil parts.

Board for Mounting Coil Electronic Component

Figure 7:
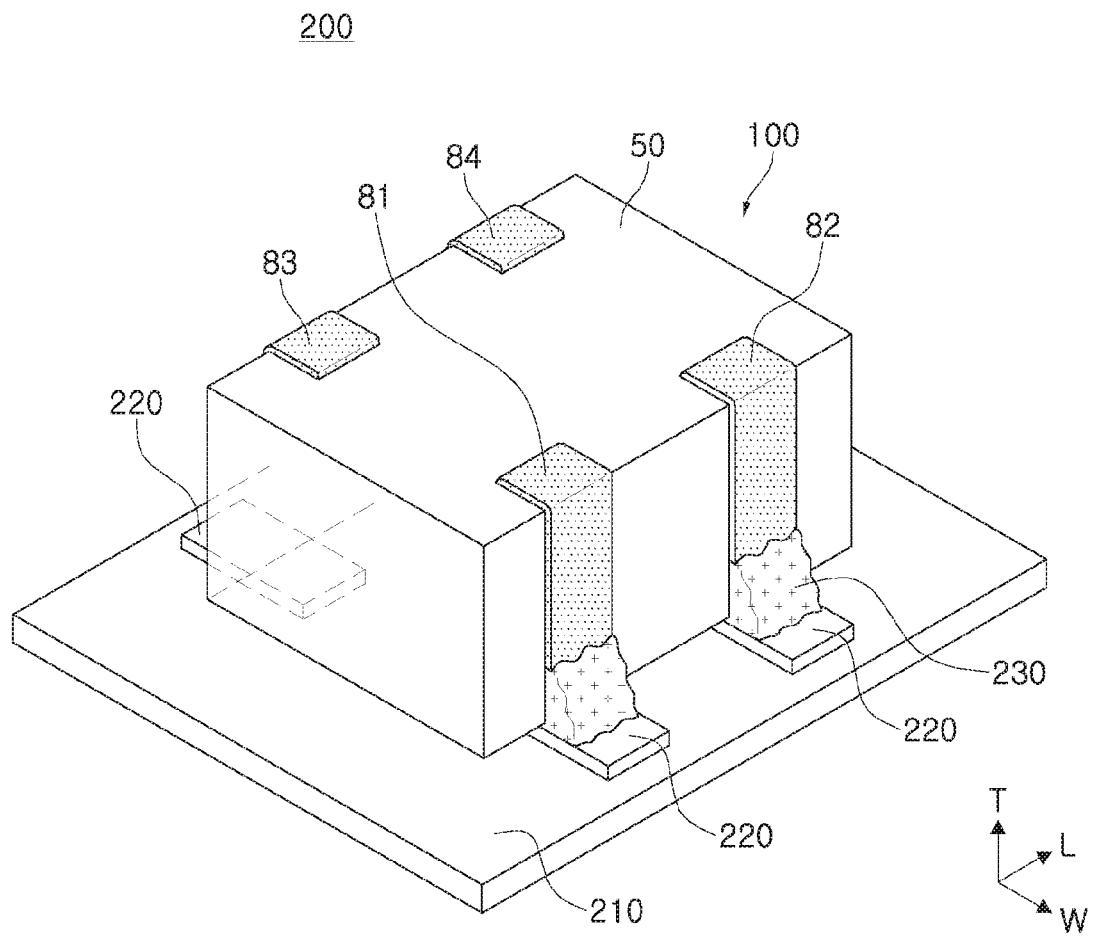
FIG. 7 is a perspective view illustrating a figure in which the coil electronic component of FIG. 1 is mounted on a printed circuit board (PCB).

FIG. 7 is a perspective view illustrating a figure in which the coil electronic component of FIG. 1 is mounted on a printed circuit board (PCB).

Referring to FIG. 7, a board 200 for mounting a coil component 100 according to an exemplary embodiment may include a printed circuit board 210 on which the coil component 100 is mounted, and a plurality of electrode pads 220 formed on an upper surface of the printed circuit board 210 to be spaced apart from each other.

In this case, the coil electronic component 100 may be soldered by a solder 230 to be electrically connected to the printed circuit board 210 in a state in which first to fourth external electrodes 81, 82, 83 and 84 disposed on outer surfaces of the coil electronic component 100 are each disposed on the electrode pads 220 to be in contact with each other.

Except for the above-mentioned description, a description of features overlapping those of the coil electronic component according to the exemplary embodiment described above will be omitted.

As set forth above, according to exemplary embodiments in the present disclosure, the harmful mutual interference of the magnetic flux occurring from the plurality of coil parts disposed in the coil may be suppressed.

Further, the coupling value may be controlled by adjusting the mutual interference between the coil parts.

While exemplary embodiments have been shown and described above, it will be apparent to those skilled in the art that modifications and variations could be made without departing from the scope of the present invention as defined by the appended claims.

What is claimed is:

1. A coil electronic component comprising:
a magnetic body including first and second coil parts spaced apart from each other, wherein the coil parts each include first and second coil conductors respectively disposed on first and second surfaces of a substrate, and
a non-magnetic film disposed between the first and second coil parts,
wherein a main surface of the non-magnetic film is disposed to be perpendicular to a main surface of the substrates of the first and second coil parts.

2. The coil electronic component of claim 1, wherein the non-magnetic film includes glass.

3. The coil electronic component of claim 2, wherein the glass is dispersed in the non-magnetic film.

4. The coil electronic component of claim 1, wherein the non-magnetic film has permeability lower than that of the magnetic body.

5. The coil electronic component of claim 1, wherein the first and second coil parts each include first and second lead parts respectively exposed to first and second side surfaces of the magnetic body in a width direction of the magnetic body, and
the first lead parts are connected to first and second external electrodes disposed on the first side surface of the magnetic body, and the second lead parts are connected to third and fourth external electrodes disposed on the second side surface of the magnetic body.

6. The coil electronic component of claim 5, wherein the first and second external electrodes are input terminals, and the third and fourth external electrodes are output terminals.

7. The coil electronic component of claim 1, wherein the magnetic body includes a magnetic metallic powder dispersed in a thermosetting resin.

8. The coil electronic component of claim 1, wherein the first and second coil conductors are coated with an insulating layer.

9. The coil electronic component of claim 1, wherein the non-magnetic film includes any one or more selected from the group consisting of a thermosetting resin, a metallic magnetic powder, a ferrite, and a dielectric.

10. A coil electronic component comprising:

a magnetic body including first and second coil parts spaced apart from each other, wherein the coil parts each include first and second coil conductors respectively disposed on first and second surfaces of a substrate, and a gap part disposed between the first and second coil parts, and suppressing mutual interference of magnetic flux occurring from the first and second coil parts, wherein a main surface of the gap part is disposed to be perpendicular to a main surface of the substrates of the first and second coil parts.

11. The coil electronic component of claim 10, wherein the gap part includes glass.

12. The coil electronic component of claim 10, wherein the gap part has permeability lower than that of the magnetic body.

13. The coil electronic component of claim 10, wherein the first and second coil parts each include first and second lead parts respectively exposed to first and second side surfaces of the magnetic body in a width direction of the magnetic body, and the first lead parts are connected to first and second external electrodes disposed on the first side surface of the magnetic body, and the second lead parts are connected to third and fourth external electrodes disposed on the second side surface of the magnetic body.

14. The coil electronic component of claim 13, wherein the first and second external electrodes are input terminals, and the third and fourth external electrodes are output terminals.

15. A board having a coil electronic component comprising:

a circuit board including first to fourth electrode pads; and the coil electronic component of claim 5 mounted on the circuit board so that the first to fourth external electrodes are disposed on the first to fourth electrode pads, respectively.

16. A board having a coil electronic component comprising:

a circuit board including first to fourth electrode pads; and the coil electronic component of claim 13 mounted on the circuit board so that the first to fourth external electrodes are disposed on the first to fourth electrode pads, respectively.

17. A coil electronic component comprising:

a magnetic body including first and second coil parts spaced apart from each other, wherein the coil parts each include first and second coil conductors respectively disposed on first and second surfaces of a substrate, and a non-magnetic film disposed between the first and second coil parts, wherein the first and second coil parts each include first and second lead parts respectively exposed to first and second side surfaces of the magnetic body in a width direction of the magnetic body, and the first lead parts are connected to first and second external electrodes disposed on the first side surface of the magnetic body, and the second lead parts are connected to third and fourth external electrodes disposed on the second side surface of the magnetic body.

18. The coil electronic component of claim 17, wherein the first and second external electrodes are input terminals, and the third and fourth external electrodes are output terminals.

19. The coil electronic component of claim 17, wherein the non-magnetic film includes glass.

20. The coil electronic component of claim 19, wherein the glass is dispersed in the non-magnetic film.

* * * * *